(12) United States Patent
Philippou et al.

(10) Patent No.: US 7,270,922 B1
(45) Date of Patent: Sep. 18, 2007

(54) METHOD FOR DETERMINING AN EDGE PROFILE OF A VOLUME OF A PHOTORESIST AFTER A DEVELOPMENT PROCESS

(75) Inventors: Alexander Philippou, Dresden (DE); Thomas Mülders, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/371,237

(22) Filed: Mar. 9, 2006

(51) Int. Cl.
*G03C 5/00* (2006.01)
(52) U.S. Cl. .................. 430/30; 430/322; 430/330; 430/331
(58) Field of Classification Search .................. 430/30, 430/322, 330, 331
See application file for complete search history.

(56) References Cited

U.S. PATENT DOCUMENTS 5,446,870 A  8/1995  Hinsberg

OTHER PUBLICATIONS

Burns, S. D. et al. (2002). "Advancements to the Critical Ionization Dissolution Model," *J. Vac. Sci. Technol. B* 20(2):537-543.
Gillespie, D. T. (1976). "A General Method for Numerically Simulating the Stochastic Time Evolution of Coupled Chemical Reactions," *Journal of Computational Physics* 22:403-434.
Houle, F. A. et al. (2002). "Kinetic Model for Positive Tone Resist Dissolution and Roughening," *Macromolecules* 35:8591-8600.

*Primary Examiner*—Christopher G. Young
(74) *Attorney, Agent, or Firm*—Patterson & Sheridan, L.L.P.

(57) ABSTRACT

The present invention relates to a method for determining an edge profile of a volume of a photoresist after a development process. At first, the volume of the photoresist is divided into cells. A chemical master equation is set up which reflects the stochastic kinetics of chemical reactions proceeding in cells of the volume of the photoresist during the development process. The chemical master equation is solved for a given development time on the basis of a Gillespie algorithm in order to determine developed and non-developed cells of the volume of the photoresist at the end of the development process. Finally, the edge profile of the volume of the photoresist after the development process is determined on the basis of a cluster of non-developed cells.

19 Claims, 9 Drawing Sheets

Move into new class

Delete cell i in class k

METHOD FOR DETERMINING AN EDGE PROFILE OF A VOLUME OF A PHOTORESIST AFTER A DEVELOPMENT PROCESS

TECHNICAL FIELD OF THE INVENTION

The present invention relates to a method for simulating the complex kinetics of chemical reactions, and in particular, to a method for determining an edge profile of a volume of a photoresist after a development process.

BACKGROUND OF THE INVENTION

The fabrication of highly integrated electrical circuits with small structural dimensions requires special structuring procedures. One of the most common procedures is the so-called lithographic structuring method. This method comprises depositing a thin layer of a radiation sensitive photoresist on the surface of a semiconductor substrate disk, also referred to as wafer, applying a so-called soft bake step during which the solvent content of the photoresist is reduced and exposing the photoresist to radiation transmitted through a lithographic mask. In the so-called photolithography, electromagnetic radiation is used. During the exposure step, lithographic structures located on the mask are imaged on the photoresist layer. Afterwards, a so-called post exposure bake (PEB) follows, and subsequently a development process is conducted during which structuring of the photoresist layer takes place. The thus structured photoresist layer can be directly used in a subsequent etch process or a doping implant performed in order to form electronic structures in the surface of the wafer.

One main demand of the semiconductor industry is the continuous power enhancement provided by increasingly faster integrated circuits which is interrelated to a miniaturization of the electronic structures. In order to realize smaller dimensions of electronic structures, in particular smaller lateral dimensions also referred to as critical dimensions (CD), lithography facilities and tools are continually improved. In addition, newly developed photoresist materials are applied as well as the performance of existing photoresists is steadily enhanced.

Generally computer simulations reflecting the complex kinetics of chemical reactions proceeding in a volume of a photoresist during different process steps of a lithography procedure are performed in order to predict the performance of novel photoresists and to enhance the material composition of existing photoresists. In particular simulation methods reflecting the chemical kinetics during a development process are considered to have high significance as these methods allow determining an edge profile of a developed photoresist. On the basis of such a simulated resist profile, hindrances limiting lithography performance, in particular surface or profile roughnesses like the so-called line edge roughness (LER) can be detected. As the dimensions of electronic structures are continually decreased, such roughnesses have an ever significant importance.

At present so-called chemically amplified resists (CAR) play a major role in the semiconductor industry. Such photoresists feature a high sensitivity and are therefore particularly used in the volume production of semiconductor chips. In the case of a positive tone chemically amplified photoresist, the photoresist comprises so-called photo acid generator molecules (PAG) and blocking groups, also referred to as dissolution inhibitors, which are attached to polymers of the photoresist. Thereby the inhibitors prevent dissolution of photoresist polymers in a development process.

In the course of an exposure step, during which the photoresist is exposed to electromagnetic radiation e.g. in the deep UV spectral range, photo acid generator molecules of a chemically amplified photoresist are decomposed while generating acid molecules. During a subsequent post exposure bake step, the photogenerated acid diffuses through the polymer matrix of the photoresist, in this way decomposing dissolution inhibitors attached to the polymers (acid catalyzed decomposition). Thereby new acid molecules are generated in the course of such decomposition reactions which can further diffuse through the volume of the photoresist, thus causing further decomposition reactions of dissolution inhibitors. Due to this feature such photoresists are referred to as chemically amplified photoresists. A consequence of the post exposure bake is that initially blocked polymer sites of photoresist polymers are "deprotected" in and close to radiation exposed regions of the photoresist.

In a subsequent development step the photoresist is exposed to a suitable developer solution, normally an aqueous base. The main development mechanism is the ionization reaction of hydroxide ions with deprotected polymer sites of the polymer resin and the subsequent dissolution of the respective polymers. Thereby the probability for dissolution depends on several factors, e.g. polymer length, developer penetration depth, deprotection ratio and developer concentration. Depending on the amount of deprotection resulting from the preceding post exposure bake the polymers are ionized and change their chemical properties to become hydrophilic instead of hydrophobic, thus getting dissolved in the aqueous developer solution.

In the case of a negative tone chemically amplified photoresist, so-called cross-linker molecules are typically attached to the polymers. Again, during an exposure step photo acid generator molecules generate acid molecules due to radiation induced decomposition reactions. In a subsequent post exposure bake, the photogenerated acid molecules diffuse through the volume of the photoresist and react with the cross-linkers attached to the polymers. In this way a cross-linking between respective polymers takes place (acid catalyzed condensation). Thereby new acid molecules are generated, thus being able to induce further cross-linking reactions. In a subsequent development step, polymers comprising cross-linked polymer sites are protected against dissolution. Consequently cross-linked polymers correspond to polymers of a positive tone photoresist which comprise dissolution inhibitors.

As a consequence, the above described performance of a negative tone chemically amplified photoresist can be understood to that effect that initially all polymers do not comprise protecting inhibitor groups, and that inhibitors attached to the polymers and protecting the same against dissolution in a development step are "generated" in radiation exposed regions of the photoresist during a post exposure bake. Though lacking an exact physical or chemical description of the reaction processes occurring in a volume of a negative tone chemically amplified photoresist, this way of understanding will be assumed in the following.

Accordingly, this way of understanding is also applied in the case of a chemically amplified photoresist, at which protection or deprotection of polymers is based on other reaction processes like e.g. a polarity change taking place in the course of a post exposure bake.

At present a number of simulation methods exist which reflect the complex stochastic kinetics of chemical reactions proceeding in a photoresist, in particular a chemically amplified photoresist during a development process. Such methods are e.g. based on the stochastic simulation method described in U.S. Pat. No. 5,446,870. Another example of a method for modeling the dissolution taking place in a positive tone resist during a development step is disclosed in W. D. Hinsberg, F. A. Houle and M. I. Sanchez, Kinetic Model for Positive Tone Resist Dissolution and Roughening, Macromolecules, 8591 (2002).

However, conventional simulation methods generally require a high computing time. As a consequence the practical application of such methods in order to predict an edge profile of a volume of a photoresist after a development process is limited. Moreover the existing methods do not model on a molecular level so that fluctuations like e.g. polymer density variations, fluctuations induced by reaction mechanisms and variations in polymer length and developer penetration depth, which have an impact on roughness of a photoresist like the line edge roughness are taken into account only to some degree. Therefore current methods ability to predict a possible "resist brick wall" where line edge roughness becomes an insurmountable lithography hindrance is shortened.

SUMMARY OF THE INVENTION

The present invention generally relates to methods for simulating the complex kinetics of chemical reactions proceeding in a volume of a photoresist during process steps of a lithography procedure. More particularly, the invention relates to methods for simulating the kinetics of chemical reactions proceeding in a volume of a photoresist during a development process. More particularly yet, the invention is concerned with a method for determining an edge profile of a volume of a photoresist after a development process.

One advantage of an embodiment of the present invention is to provide a fast and efficient method for determining an edge profile of a volume of a photoresist after a development process.

Another advantage of an embodiment of the present invention is to provide a method for determining an edge profile of a volume of a photoresist after a development process which models the kinetics of chemical reactions proceeding in the photoresist on a molecular level in order to incorporate the above described fluctuation effects to a high degree.

A further advantage of an embodiment of the present invention is to provide a method for determining an edge profile of a volume of a photoresist after a development process which allows to predict a roughness in the developed profile of the photoresist limiting the quality of a lithography procedure with a high accuracy.

According to one aspect of the present invention, a method for determining an edge profile of a volume of a photoresist after a development process is provided. In a first step, the volume of the photoresist is divided into cells. A chemical master equation is set up which reflects the stochastic kinetics of chemical reactions proceeding in cells of the volume of the photoresist during the development process. Subsequently, the chemical master equation is solved for a given development time on the basis of a Gillespie algorithm in order to determine developed and non-developed cells of the volume of the photoresist at the end of the development process. Here, the expression "developed" cell means an empty cell which comprises no more photoresist components. In a subsequent step, the edge profile of the volume of the photoresist after the development process is determined on the basis of a cluster of non-developed cells.

A description of the standard Gillespie algorithm is disclosed in D. T. Gillespie, A General Method for Numerically Simulating Stochastic Time Evolution of Coupled Chemical Reactions, J. Comp. Physics 22, 403 (1976).

Due to the fact that the inventive method applies a chemical master equation in combination with a Gillespie algorithm, the kinetics of chemical reactions proceeding in a volume of a photoresist during a development process can be modeled with a high precision, particularly on a molecular level. Consequently, different types of fluctuations which are e.g. based on the discrete or molecular composition of the photoresist or on variations induced by reaction mechanisms can be incorporated. Thus it is possible to predict a roughness in the developed profile of the photoresist with a high accuracy. Consequently the inventive method contributes to discover the reasons for such roughness phenomena limiting the performance of a lithography procedure so that the impact of the same can be minimized. In addition the prediction of a possible resist brick wall where line edge roughness becomes an insurmountable lithography hindrance is made possible. Moreover solving the chemical master equation on the basis of a Gillespie algorithm is relatively fast and efficient. As a consequence simulating the development process for a volume of a photoresist can be carried out within a reasonable computation time.

The inventive method can be applied to determine the developed edge profile of any kind of photoresist, which includes chemically amplified resists and photoresists having no chemical amplification of either tone.

In a preferred embodiment of the present invention, the chemical master equation reflects the stochastic kinetics of the main chemical reactions between polymer sites of polymers comprised in the volume of the photoresist and components of a developer solution used for the development of the photoresist, i.e. ionization and neutralization reactions. In this connection, a non-protected neutral polymer site can be ionized in an ionization reaction. Because this reaction is reversible, an ionized polymer site can also be deionized in a respective neutralization reaction.

In another preferred embodiment of the present invention, a critical ionization level is defined for the polymers. When a fraction of ionized polymer sites of a polymer exceeds the critical ionization level, the respective polymer is removed from the volume of the photoresist. A detailed description of the application of a critical ionization model is e.g. disclosed in P. C. Tsiartas, S. D. Burns, G. M. Schmid and C. G. Willson, Advancements to the Critical Ionization Dissolution Model, J. Vac. Sci. Technol. B 20, 537 (2002).

In another preferred embodiment of the present invention, an initial spatial distribution of polymers comprised in the volume of the photoresist at the beginning of the development process including information on protected and non-protected polymer sites is defined previous to solving the chemical master equation.

Preferably, the initial spatial distribution of polymers is defined on the basis of a molecular dynamic calculation. In this way modeling of the chemical reactions proceeding in the course of the development process is based on a realistic polymer distribution corresponding to an assumed homogeneous density of an actual photoresist.

In an alternative preferred embodiment of the present invention, an initial spatial distribution of polymers at the beginning of the development process is defined by assigning polymer sites of polymers to cells of the volume of the photoresist by means of a stochastic approach. This embodiment, which can particularly be realized by distributing polymers on the cells by means of a random walk, makes it also possible to provide a realistic initial spatial distribution of photoresist polymers.

In another preferred embodiment of the present invention, the polymers comprised in the volume of the photoresist have lengths according to a length distribution. In this way a realistic model of the photoresist can be applied.

In this connection the length distribution of the polymers is preferably based on measurements of characteristic parameters of a photoresist sample. Such parameters include e.g. molecular weights or the so-called polydispersity.

In another preferred embodiment of the present invention, a reaction front and a reaction radius is defined. The reaction front comprises cells of the volume of the photoresist being accessible to a developer solution. When a cell of the reaction front is developed, all surrounding cells within the reaction radius are added to the reaction front. This approach makes it possible to model the penetration and the diffusion processes of the developer solution inside the photoresist during the development process in a realistic manner.

In another preferred embodiment of the present invention, each cell of the volume of the photoresist being accessible to a developer solution during the development process is assigned a cell reactivity. The cell reactivity is a parameter which reflects the probability or rate with which the respective cell changes its state due to a chemical reaction. In the course of solving the chemical master equation on the basis of the Gillespie algorithm a reacting cell in which a chemical reaction proceeds is selected according to its cell reactivity.

In another preferred embodiment of the present invention, the chemical master equation is solved by means of an enhanced Gillespie algorithm, which comprises a von Neumann rejection in order to select a reacting cell of the volume of the photoresist. The von Neumann rejection scheme speeds up selecting a reacting cell, in this way speeding up the inventive method and is particularly useful when dealing with a large number of cells from which a possible reacting cell is drawn.

In yet another preferred embodiment of the present invention, the cells of the volume of the photoresist being accessible to the developer solution during the development process are classified in logarithmic classes according to the cell reactivities. Furthermore each logarithmic class is assigned a class reactivity. In this embodiment selecting a reacting cell comprises the steps of selecting a reacting class according to its class reactivity and subsequently selecting a reacting cell within the selected class. By applying the concept of logarithmic classes, the above described von Neumann rejection can be carried out more efficiently, in particular when dealing with very differing values of cell reactivities. As a consequence, the inventive method is further sped up.

According to another aspect of the present invention, a method for determining an edge profile of a volume of a photoresist after a development process is provided. In a first step, the volume of the photoresist is divided into cells. Thereby the cells have a given cell volume. A chemical master equation is set up, which reflects the stochastic kinetics of chemical reactions proceeding in cells of the volume of the photoresist being accessible to a developer solution during the development process. Thereby the volume of the photoresist is treated as a chemical reaction system. In this way the chemical master equation describes the time evolution of the probability of the reaction system to be found in a state n at a time t during the development process provided it had been in an initial state n″ at a time $t_0=0$ at the beginning of the development process according to $$\frac{\partial}{\partial t} p(n, t | n'').$$

Here the state n and the state n″ of the reaction system represent the number of photoresist components comprised in the cells of the volume of the photoresist at the respective times t and $t_0$. Furthermore, an initial spatial distribution of photoresist components comprised in the cells of the volume of the photoresist at the beginning of the development process is defined. Subsequently, the chemical master equation is solved for a given development time on the basis of a Gillespie algorithm in order to determine developed and non-developed cells of the volume of the photoresist at the end of the development process. Afterwards, the edge profile of the volume of the photoresist after the development process is determined on the basis of a cluster of non-developed cells.

In a similar manner this method makes it possible to model the complex kinetics of chemical reactions proceeding in a volume of a photoresist during a development process with a high accuracy, in particular on a molecular level. As a consequence fluctuations which result in a surface or profile roughness of the photoresist can be incorporated. In addition, the method is relatively fast and efficient so that determining a developed profile of the volume of the photoresist can be carried out within a reasonable computation time.

BRIEF DESCRIPTION OF THE DRAWINGS

The present invention will be described in more detail below with reference to the exemplary embodiments and drawings, in which.

DETAILED DESCRIPTION OF THE INVENTION

The embodiments of the present invention described in the following are suited for determining an edge profile of a volume of a chemically amplified photoresist after a development process. Starting point of an inventive method typically is a volume of a photoresist which was subjected to a post exposure bake preceding the development process. Thereby it is assumed that a fraction of polymer sites of polymers of the photoresist are blocked or protected by dissolution inhibitors. More precisely, this condition is only fulfilled in the case of a positive tone photoresist. As mentioned above, this way of understanding is also applied in the case of a negative tone photoresist, though lacking an exact physical or chemical characterization.

Figure 1:
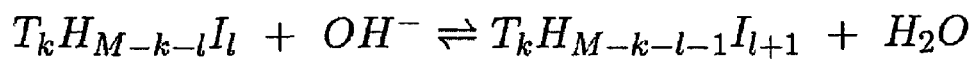
FIG. 1 is a reaction scheme for a polymer of a photoresist.

FIG. 1 shows a typical reaction scheme for a polymer of a photoresist during a development process illustrating a reversible ionization reaction between the polymer and components of a developer solution which is an aqueous base. The polymer has a length M, which stands for the number of polymer sites, and comprises k protected polymer sites and 1 ionized polymer sites. Here T symbolizes the protected polymer sites, H the non-protected polymer sites which can be ionized, I the ionized polymer sites, $OH^-$ the reacting hydroxide group of the aqueous base and $H_2O$ the resulting water molecule after the ionization reaction. If more than a certain fraction, the so-called critical ionization level, of polymer sites are ionized, the polymer is dissolved.

Besides an ionization reaction, also a neutralization reaction between a polymer and a water molecule can occur. In this way an ionized polymer site of the polymer is neutralized. However, the probability of an ionization reaction exceeds the probability of a neutralization reaction. As described later, in a preferred embodiment of the present invention a ratio between the probability of an ionization reaction and the probability of a neutralization reaction is set to 100:1.

Figure 2:
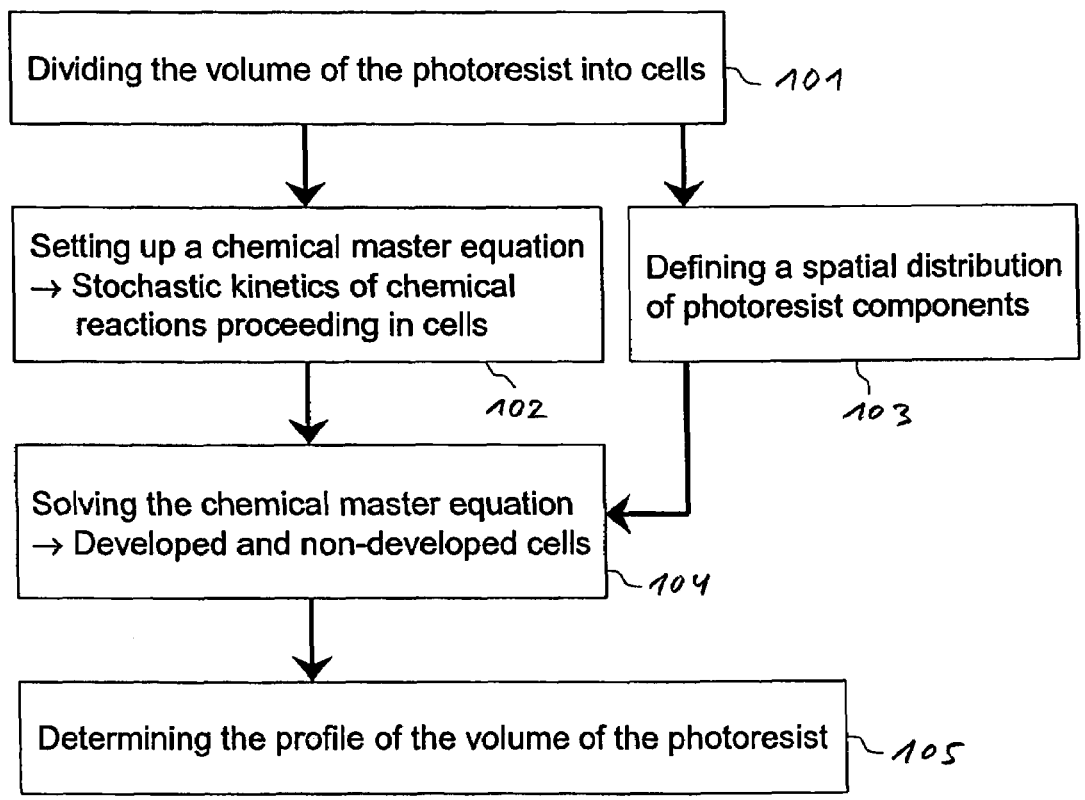
FIG. 2 is a flow diagram illustrating the basic steps of a preferred embodiment of a method according to the invention for determining an edge profile of a volume of a photoresist after a development process.
Figure 7:
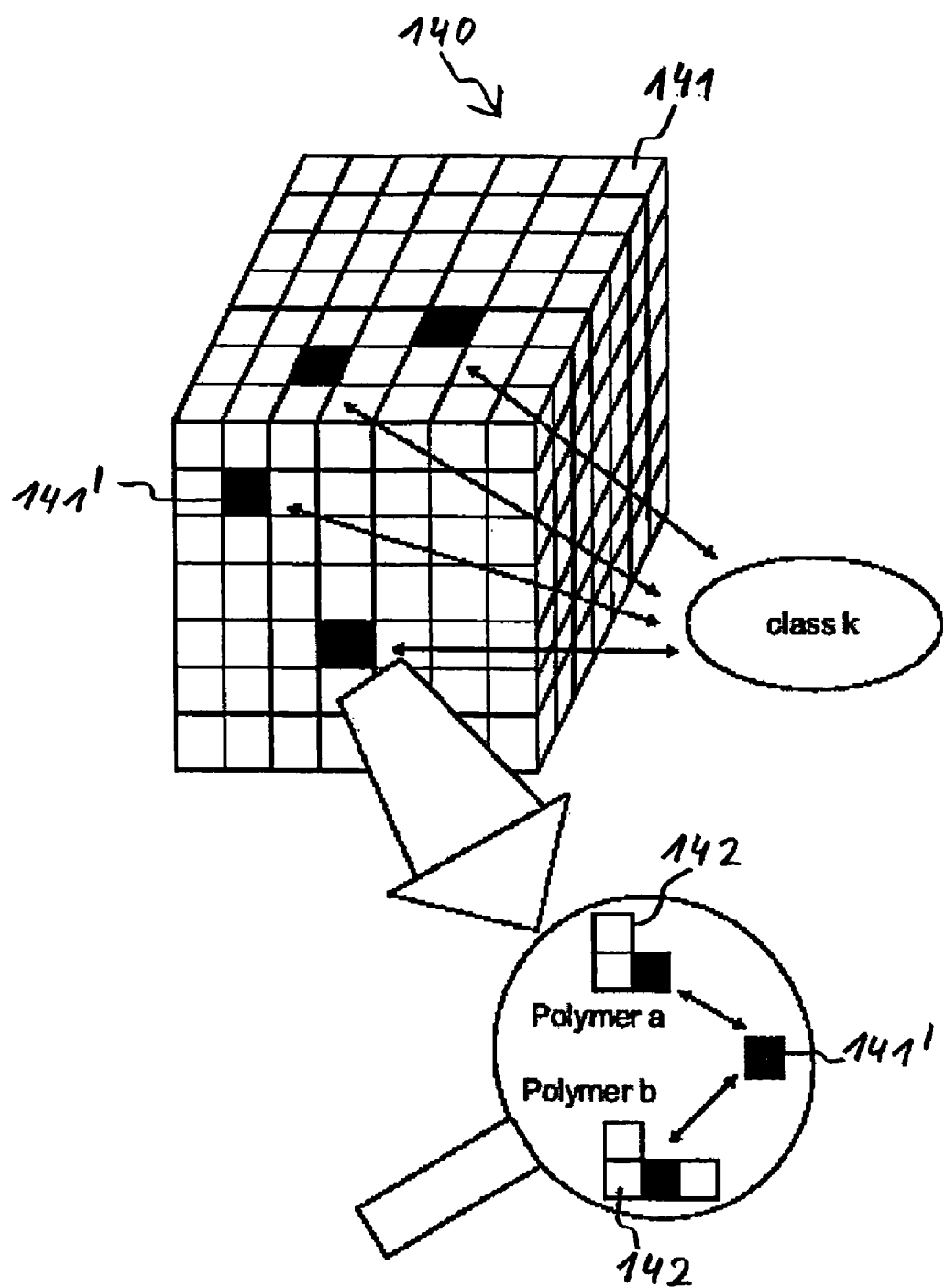
FIG. 7 is a volume of a photoresist divided into cells, wherein the cells are linked to classes and to polymers of the photoresist.

FIG. 2 shows a flow diagram illustrating the basic steps of a preferred embodiment of an inventive method for determining an edge profile of a given volume of a photoresist after a development process. In a first step 101 the volume of the photoresist, which is e.g. located on the surface of a substrate, is divided into a lattice of equal cells. The cells are preferably cubic and have a given cell volume. An example of a volume of a photoresist which is divided into a lattice 140 of cells 141 is depicted in FIG. 7.

As can be seen from FIG. 2, in a further step 102 a chemical master equation is set up which reflects the stochastic kinetics of chemical reactions proceeding in cells of the volume of the photoresist being accessible to a developer solution during the development process. With regard to the above described ionization and neutralization reactions between polymer sites of the resist polymers and components of the developer solution, the master equation preferably is of the form:

$$\frac{\partial}{\partial t}p(\ldots, n_v^H, n_v^I, n_v^P, \ldots, t|n'') = \quad (1)$$

$$\sum_v k_1(n_v^H + 1)p(\ldots, n_v^H + 1, n_v^I, n_v^P, \ldots, t|n'') +$$

$$\sum_v k_2(n_v^I + 1)p(\ldots, n_v^H, n_v^I + 1, n_v^P, \ldots, t|n'') -$$

$$p(\ldots, n_v^H, n_v^I, n_v^P, \ldots, t|n'') \times \sum_v (k_1 n_v^H + k_2 n_v^I)$$

Here $n_v^H$ denotes the number of neutral polymer sites, $n_v^I$ the number of ionized polymer sites and $n_v^P$ the number of protected polymer sites in a cell denoted by a cell index v. The parameter $k_1$ is a model dependent factor which fixes the time scale of the ionization reactions, whereas $k_2$ is a factor fixing the time scale of the neutralization reactions.

Although the protected polymer sites do not participate directly in any ionization or neutralization reactions, they impact on the solubility of a polymer. A polymer can have enough protected polymer sites such that it never meets the solubility criterion defined by the critical ionization.

The volume of the photoresist is treated as a chemical reaction system, wherein the state of the reaction system, in the following denoted by n, at a time t during the development process is characterized by the number of neutral, ionized and protected polymer sites in all of the cells that are in contact with the developer solution, i.e.

$$n = \{\ldots, n_v^H, n_v^I, n_v^P, \ldots\} = \{n_1^H, n_1^I, n_1^P, \ldots, n_v^H, n_v^I, n_v^P, \ldots n_{M_{cell}}^H, n_{M_{cell}}^I, n_{M_{cell}}^P\} \quad (2).$$

Here, $M_{cell}$ is the total number of all cells which are accessible to the developer solution. In the following, such cells being in contact with the developer solution are referred to as "reaction front".

In equation (1) the parameter n" represents an initial state of the reaction system and therefore the number of polymer sites of all cells of the reaction front at a time $t_0=0$ at the beginning of the development process. The expression p($\ldots, n_v^H, n_v^I, n_v^P, \ldots$ t|n") is the probability of the reaction system to be found in a state n at a time t during the development process provided it had been in an initial state n" at a time $t_0$ at the beginning of the development process. As can be seen from equation (1), the chemical master equation describes the time evolution of this transition probability.

The expression $k_1 n_v^H + k_2 n_v^I$ of the last summation term of equation (1) corresponds to a cell reactivity, in the following denoted by $W_v$. The cell reactivity $W_v$, accordingly given by $$W_v = k_1 n_v^H + k_2 n_v^I \quad (3),$$

represents the transition probability or rate with which the state of the respective cell v is changed due to an ionization or neutralization reaction.

The reactivity of the entire volume of the photoresist, or of the reaction system in state n respectively, is characterized by the total reactivity, in the following denoted by $W_n$. Thereby the total reactivity $W_n$ of system state n is given by a sum over all cell reactivities $W_v$ of all cells v of the reaction front, i.e.

$$W_n = \sum_v W_v = \sum_v (k_1 n_v^H + k_2 n_v^I). \quad (4)$$

The total reactivity $W_n$ characterizes the transition probability or rate with which the reaction system leaves the state n at a time t during the development process due to a chemical reaction.

Because of the fact that the kinetics of the chemical reaction system is described by means of a chemical master equation, chemical reactions proceeding in the volume of the photoresist in the course of the development process can be modeled with a high accuracy. In particular, the chemical master equation approach makes it possible to model chemical reactions on a molecular level. In this way fluctuations having a significant influence on the shape of a developed photoresist profile like e.g. polymer density variations, fluctuations induced by reaction mechanisms and variations of polymer length and developer penetration depth can be incorporated. As a consequence the inventive method allows predicting the influence of such statistical effects on the performance of a photoresist in a development process.

To this end, the chemical master equation is solved in a process step 104 for a given development time in order to determine developed and non-developed cells of the volume of the photoresist at the end of the development process, as can be seen from FIG. 2. Here, the expression "developed" cell means a cell which comprises no more polymer sites because the respective polymers are dissolved in the course of the development process.

However, previous to solving the chemical master equation, an initial spatial distribution of photoresist components, i.e. a spatial distribution of polymers comprised in the volume of the photoresist at the beginning of the development process including information on protected and non-protected polymer sites, is defined in a step 103. This step 103 can be carried out independently from setting up the chemical master equation in step 102, i.e. before or after step 102.

In order to provide a polymer distribution in general, at first a polymer length or polymer lengths of the polymers are defined. In the following, a polymer length is also referred to as step length, thus characterizing the (maximum) number of cells a polymer can run through.

In a preferred embodiment of the present invention, the volume of the photoresist comprises polymers having all the same length. For this, defining a polymer length value is preferably based on measurements of characteristic parameters of a photoresist sample, e.g. measurements of the mean value of a molecular weight.

Thereby the interrelation between the step length of a polymer and its molecular weight according to $$N \approx \frac{0.36 \text{ MW}}{100 a^2} \quad (5)$$

is taken as a basis. Here N denotes a step length, MW a molecular weight and a denotes a lattice constant given in nanometers.

In an alternative embodiment of the present invention, polymers having different lengths according to a length distribution are taken as a basis. Consequently, a more realistic model of a photoresist can be applied. Preferably, the polymer length distribution is also based on measurements of characteristic parameters of a photoresist sample. In particular measurements of the so-called polydispersity are taken into account, which is the distribution of molecular weights in a given polymer sample. A measurement of a polydispersity of a photoresist sample can thus be directly transformed into a length distribution of respective polymers.

Alternatively, a mean value of a polymer length and a standard deviation can be defined in order to calculate a length distribution. Thereby the length of a polymer is e.g. given by $$L = \mu + B\sigma_D, B \in [-1,1] \quad (6),$$

wherein L denotes the length of the respective polymer, $\mu$ a mean value of a polymer length, $\sigma_D$ a standard deviation and B a uniformly distributed random number in the interval [−1, 1]. At this, the mean value $\mu$ and the standard deviation $\sigma_D$ are preferably correlated to measurements of characteristic parameters of a photoresist sample like molecular weight or polydispersity.

On the basis of a mean value $\mu$ and a standard deviation $\sigma_D$ a length distribution of photoresist polymers in the form of e.g. a Gaussian distribution can be calculated according to $$p(x) = \frac{1}{\sigma\sqrt{2\pi}} e^{\frac{(x-\mu)^2}{2\sigma^2}}, \sigma_D = \sqrt{\sigma}, \quad (7)$$

wherein x denotes the length of a polymer (x corresponds to the above mentioned length L or the step length of a polymer), p(x) the probability for a polymer to have the length value x and $\sigma$ the variance of the Gaussian distribution.

Figure 3:
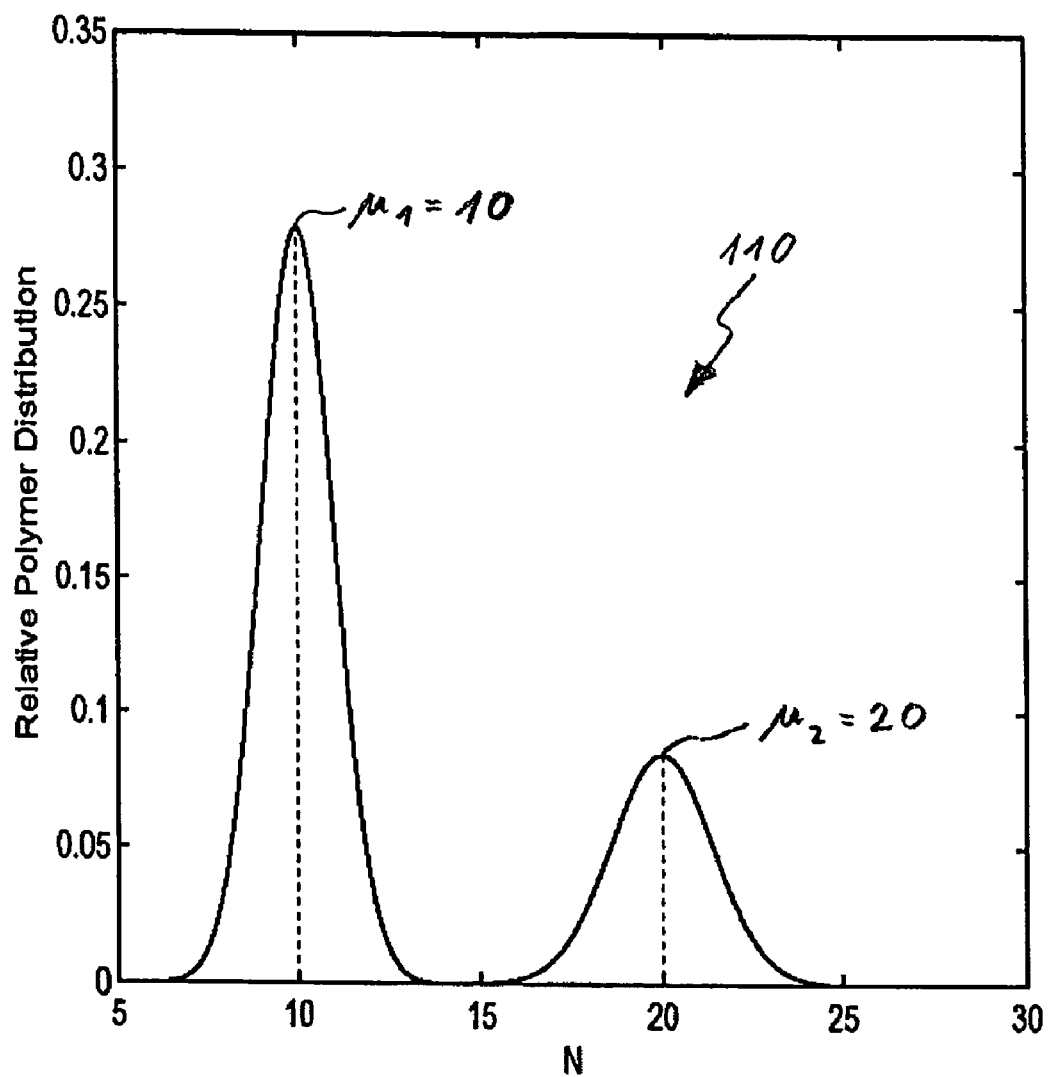
FIG. 3 is a calculated length distribution of polymers of a photoresist.

In this connection, it is also possible to define several mean values of a polymer length in conjunction with respective standard deviations. For this, FIG. 3 shows an example of a calculated length distribution 110 of polymers of a photoresist, which is based on two different mean values $\mu_1=10$ and $\mu_2=20$, expressed in steps of a step length denoted by N in FIG. 3. The standard deviations $\sigma_D$ are 1 and $\sqrt{2}$ for left and right Gaussian function. The depicted polymer length distribution 110 was calculated on the basis of equation (7).

As soon as a polymer length or polymer lengths are defined, the polymers are distributed on the cell lattice in order to provide an initial spatial polymer distribution in general. At this it is preferred to establish a list which links the individual polymer sites to corresponding cells and vice versa. Preferably a second list is established to identify a polymer to which a single polymer site belongs.

Distributing polymers on the cell lattice can be carried out by assigning polymer sites of the polymers to cells of the volume of the photoresist by means of a stochastic procedure called random walk. Here, a random start cell is chosen for a polymer having a defined (step) length, and successively neighboring cells are "filled" with polymer sites of the respective polymer wherein the direction in the path from one cell to the next is chosen at random. Afterwards, the described steps are repeated for further polymers until the cell lattice is "full".

However, this procedure might result in an inhomogeneous polymer distribution, because some cells might comprise a lot of polymer sites whereas other cells might comprise only little or even no polymer sites. In order to provide a more realistic spatial polymer distribution which (approximately) corresponds to a homogeneous density of an actual photoresist, it is preferred to carry out a modified stochastic procedure referred to as random walk with relaxing constraints in the following.

At this method a maximum number of polymer sites allowed per lattice cell is defined. If in the course of filling the cell lattice with polymers a polymer "reaches" a cell comprising a maximum number of polymer sites, an alternative neighboring cell is randomly selected for the respective polymer. As soon as a maximum "filling content" is obtained and adding of further polymers to the cell lattice is not possible, the boundary condition is relaxed such that the maximum number of polymer sites allowed in a single cell is increased by e.g. 1. This step of relaxing the boundary conditions can be repeated in the course of filling the lattice with polymers if necessary.

Figure 4:
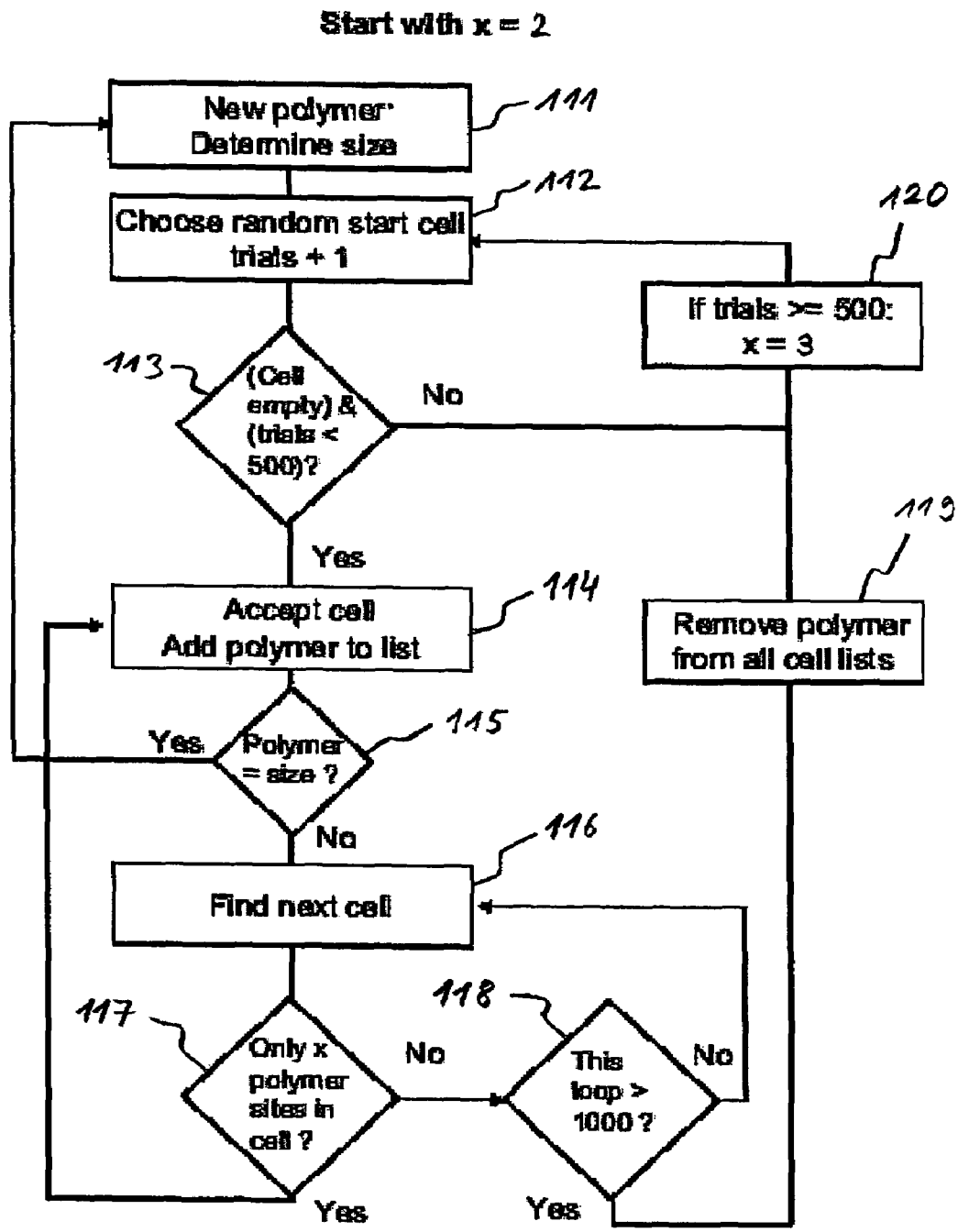
FIG. 4 is a flow diagram of a preferred embodiment of a stochastic method according to the invention for distributing polymers of a photoresist on a cell lattice.

A preferred embodiment of a random walk with relaxing constraints carried out in order to distribute polymers of a photoresist on a cell lattice is depicted in the flow diagram of FIG. 4. Here x represents the boundary condition in form of allowed polymer sites x in a chosen cell. If a cell is already full, filling of the same is forbidden. If no more polymers can be distributed on the cell lattice, x is increased.

At the beginning, x is set to 2, i.e. two polymer sites are allowed per single cell. In a first step 111, a (new) polymer is chosen and its size is determined. In this connection size means step length. In a subsequent step 112 a start cell is randomly chosen and a number of trials is increased by 1. If the chosen cell is still "empty", i.e. the cell does not (yet) comprise the maximum number of allowed polymer sites per cell, and the number of trials is less than 500 (step 113), the respective cell is accepted in a step 114 and the polymer is added to a cell list. If the cell already comprises the maximum number of polymer sites x, a new start cell is randomly chosen and the number of trials is again increased by 1 (step 112). These steps are repeated until an empty cell is accepted, as the case may be. If all polymer sites of the respective polymer are already assigned to cells of the lattice (step 115), the procedure starts again with choosing a new polymer in step 111.

If the respective polymer still comprises polymer sites not being assigned to cells yet (step 115), a next neighboring cell is randomly chosen in a step 116. If this cell does not (yet) comprise the maximum number of allowed polymer sites x (step 117), this cell is accepted in step 114 and again the polymer is added to the cell list. These steps are repeated as the case may be.

If the chosen cell is already full (step 117), a next cell is chosen in step 116, and if this cell is empty, it is accepted (steps 117, 114). If this cell is also already full, step 116 is repeated again. If this loop exceeds the number of 1000 retries (step 118), the respective polymer is removed from all cell lists in a step 119 and a new start cell is chosen for this polymer in step 112.

If the number of trials to choose a start cell which is still empty (step 113) exceeds 500, the boundary conditions are relaxed such that x is set to 3 (step 120) and filling of the cell lattice is continued. In addition, it is possible to increase x further times if necessary.

The described procedure makes it possible to provide an initial spatial distribution of polymers in the volume of the photoresist basically corresponding to a homogeneous polymer density. In addition, further procedures are imaginable in order to define such a spatial distribution of photoresist components.

In an alternative preferred embodiment of the present invention, an initial spatial distribution of polymers comprised in the volume of the photoresist is provided on the basis of a molecular dynamic calculation. For this, "boxes" of a given volume are defined which are filled with a number of twisted polymers by means of a molecular dynamic calculation. Thereby a filled box comprises e.g. 3 twisted polymers. Subsequently, the filled boxes are stringed together in order to constitute a volume of a photoresist. Afterwards, this volume is divided into cells of a given cell volume, so that a cell lattice of the volume of the photoresist comprising polymer sites assigned to cells is provided.

Besides defining an initial spatial distribution of polymers in general, step 103 of the inventive method according to the flow diagram depicted in FIG. 2 also comprises defining an initial spatial distribution of protected and non-protected polymer sites in the volume of the photoresist at the beginning of the development process. For this, the distribution of protected polymer sites is preferably defined on the basis of a spatial distribution of dissolution inhibitors.

A distribution of dissolution inhibitors is preferably determined on the basis of a simulation of chemical reactions proceeding in the volume of the photoresist during a post exposure bake preceding the development process. Thereby the dissolution inhibitors can be directly linked to respective polymer sites of photoresist polymers, which are distributed on the volume of the photoresist according to one of the "filling techniques" described above, thus "creating" protected polymer sites.

Alternatively, a cell lattice and an initial distribution of photoresist polymers comprised in the volume of the photoresist are already provided for a simulation of a post exposure bake preceding the development process. For this the methods described above can be applied in an analogous manner. In this way information on protected and non-protected polymer sites, i.e. a spatial distribution of protected and non-protected polymer sites is obtained as a result of the simulation of the post exposure bake.

As soon as an initial spatial distribution of polymers comprised in the volume of the photoresist including information on protected and non-protected polymer sites is defined, the chemical master equation is solved for a given development time in a step 104, as depicted in the flow diagram of FIG. 2. In this way developed and non-developed cells of the volume of the photoresist at the end of the development process are determined.

In order to solve the chemical master equation, a standard Gillespie algorithm can be applied. For this, at first an initialization is carried out which comprises defining boundary conditions like a development time and a critical ionization level. As mentioned above, the critical ionization characterizes the fraction of polymer sites of a polymer which can be ionized until the polymer is removed from the volume of the photoresist.

In addition, a reaction front and a reaction radius is defined. Thereby the reaction front comprises cells of the volume of the photoresist being accessible to a developer solution. The initial reaction front can be defined with regard to a developer penetration depth so that for example the first three cell rows of the surface of the volume of the photoresist constitute the reaction front. Alternatively, the initial reaction front can also be defined with regard to the reaction radius such that all cells of the surface of the volume of the photoresist comprised within the reaction radius constitute the initial reaction front. On the basis of the reaction radius further cells are defined for the reaction front in the course of the development process, wherein when a cell of the reaction front is developed, all surrounding cells within the reaction radius are added to the reaction front. In this connection, a cell is developed when all polymer sites are removed from this cell.

Furthermore reactivities like in particular cell reactivities of the cells of the reaction front and a total reactivity of the reaction system are calculated according to equations (3) and (4).

After the initialization is finished, a stochastic calculation incorporating the total reactivity of the reaction system is carried out in order to determine a time interval after which a transition of the reaction system to a different state due to a chemical reaction proceeding in one of the cells of the reaction front takes place. Subsequently a reacting cell is randomly selected according to its reactivity weight. Afterwards, a reacting polymer comprised in the selected cell and thereafter the type of chemical reaction (either ionization or neutralization) are chosen. These two steps are also carried out according to respective reactivities which are calculated in advance. If a polymer meets the critical ionization level in the course of the development process, the polymer is removed from the volume of the photoresist. Subsequently, the reaction front and the respective reactivities are actualized if necessary and the described algorithm is repeated until the given development time is reached.

Finally, information is provided on developed and non-developed cells of the volume of the photoresist at the end of the development process. On the basis of this information, in particular on the basis of the largest cluster of non-developed cells still connected with a substrate, the developed edge profile of the volume of the photoresist after the development process is determined in a step 105, as can be seen from the flow diagram depicted in FIG. 2.

A possible drawback of the described standard Gillespie algorithm is a relatively high computation time. If the number of accessible cells of the reaction front is huge, it can be time consuming to select a reacting cell. As a consequence, solving the chemical master equation according to step 104 is preferably carried out by means of an enhanced Gillespie algorithm, which comprises a von Neumann rejection in order to select a reacting cell of the volume of the photoresist.

The von Neumann rejection scheme is particularly useful when dealing with a large number of cells from which a possible reacting cell should be drawn. Each cell of the reaction front can be assigned a relative reaction probability according to $$p(x) = \frac{W(x)}{W_n}, W_n = \sum_{x'} W(x'), \tag{8}$$

wherein x denotes the position of an accessible cell within the reaction front (in this connection x corresponds to the cell index v), p(x) the relative reaction probability, W(x) the respective cell reactivity of a cell x and $W_n$ the total reactivity of the reaction system. An example of relative reaction probabilities can be seen from the histogram 131 depicted in FIG. 5.

The probability for a cell x to be selected is given by its reactivity weight p(x). An accessible cell is drawn from its probability distribution p(x) inside the reaction front by comparing the values of p(x) and an arbitrary "trial" function α(x) which is bigger or equal to p(x). α is e.g. assumed as $$\alpha(x) = \max_x \{p(x)\} \forall\, x \tag{9}$$

such that the condition $$0 \leq p(x) \leq \alpha(x) \tag{10}$$

$$A \equiv \int_0^l dx \alpha(x) \tag{11}$$

is fulfilled. Here, A is the area under the curve of the trial function α.

In order to draw a cell x without searching the whole reaction front, the following von Neumann scheme is preferably applied:

At first, two random numbers C, D are drawn out of the interval [0,1[ independently from each other, and it is calculated:

$$x := \lfloor MC \rfloor + 1, C \in [0,1[ \tag{12}$$

$$y := \alpha(x) D, D \in [0,1[ \tag{13}$$

Here M denotes the number of cells of the reaction front (M corresponds to $M_{cell}$) and "⌊ ⌋" symbolizes to round down to the nearest integer.

Subsequently, a cell x (defined by equation (12)) is accepted as a possible reacting cell if the condition $$y \leq p(x) \tag{14}$$

is fulfilled. Otherwise, the respective cell x is rejected and the described steps are repeated, starting from drawing two random numbers C, D again.

Whether this cell selection algorithm works fast depends on the acceptance ratio v, which is given by $$v := \frac{\int_0^l dx p(x)}{\int_0^l dx \alpha(x)} = \frac{1}{A}. \tag{15}$$

Figure 5:
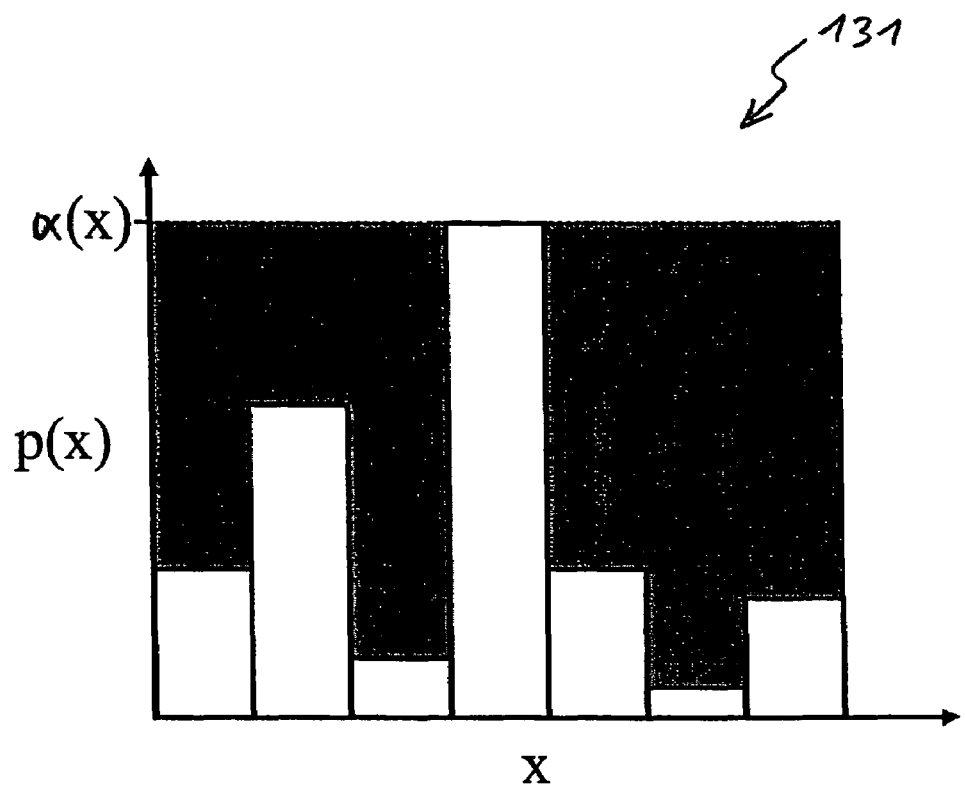
FIGS. 5 and 6 are histograms of relative reaction probabilities.

As can be seen from FIG. 5, the acceptance ratio is defined by the fraction of the areas below the two functions p(x) and α(x). The shaded area thus shows the relative probability of rejection. Therefore the less differing the relative reaction probabilities (or cell reactivities) of cells of the reaction front are, the more efficient is the acceptance ratio of the cell selection algorithm. In order to provide more similar cell reactivities, thereby speeding up the cell selection, the cells of the reaction front are preferably classified in so-called logarithmic classes.

A logarithmic class is built up of cell reactivities, wherein in each class the reactivity differs by a factor of less than e.g. 2, so that the condition $$2^{k-1} < W_v \leq 2^k \tag{16}$$

is fulfilled. Here $W_v$ denotes the cell reactivity of a cell v and k is an integer denoting a respective class. A class k thus comprises all cells v with reactivity $W_v$ which satisfy equation (16).

Figure 6:
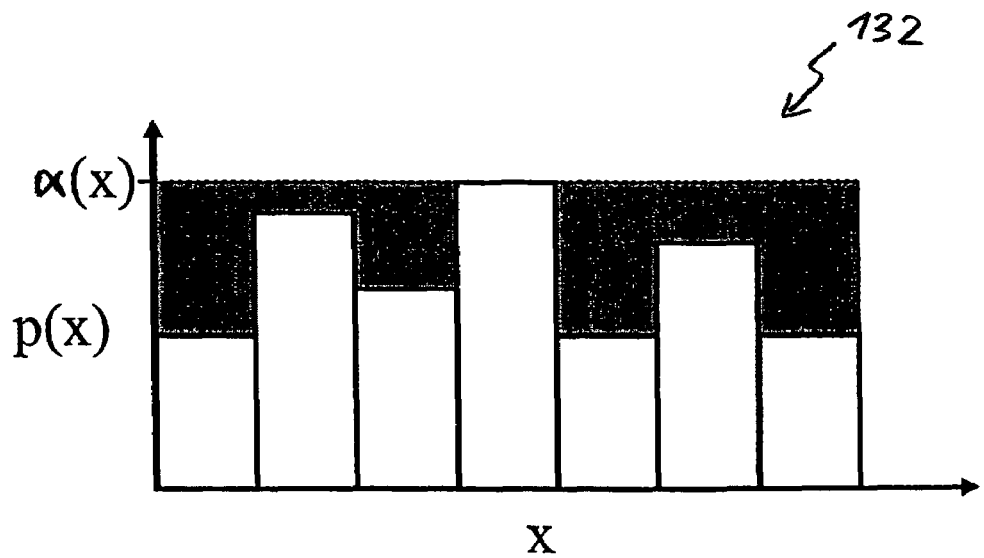

In this connection FIG. 6 shows a histogram 132 of relative reaction probabilities of cells belonging to the same logarithmic class. In comparison to the relative reaction probabilities depicted in FIG. 5, the reaction probabilities of FIG. 6 differ only by a factor ≤ 2.

FIG. 7 depicts a volume of a photoresist divided into cells 141 of a lattice 140. Thereby cells 141' whose cell reactivities fulfill the above specified equation (16) are classified in a class k. In addition FIG. 7 also indicates the correlation between cells 141, 141' and respective polymers 142. As described above, cell lists can be set up in order to link polymer sites to respective polymers and respective cells.

The overall reactivity in a class k, in the following referred to as class reactivity, is defined by $$W^{(k)} := \sum_{v \in (k)} W_v, \quad (17)$$

wherein $W^{(k)}$ denotes the class reactivity of the respective class k. The total reactivity of the reaction system is consequently given by $$W_n = \sum_k W^{(k)}. \quad (18)$$

In order to select a reacting cell, at first a reacting class is selected according to its class reactivity. Subsequently, a reacting cell is selected within this class by carrying out a von Neumann rejection. With the comparison of FIGS. 5 and 6, it can be seen that by incorporating logarithmic classes the acceptance ratio is significantly increased. This reduces the computation time from $L^2$ to $L\log(L)$, wherein L describes the system size. As L is typically in the order of $10^5$, the gain in computation efficiency is large.

An enhanced Gillespie algorithm incorporating logarithmic classes in combination with a von Neumann rejection, which can be applied to solve the chemical master equation (1) according to step 104 of the inventive method depicted in FIG. 2 preferably comprises a structure as described in the following section. Thereby reference is also made to FIG. 8 which depicts a flow diagram of this algorithm.

Initialization:

At the beginning, a reaction radius and a reaction front, i.e. cells being accessible to a developer solution, is defined (step 151). As described above, the reaction front can be constituted by cells of the surface of the volume of the photoresist comprised within the reaction radius. In addition a development time and a critical ionization level are defined. Moreover, cell reactivities $W_v$ of cells v of the reaction front and the total reactivity $W_n$ of the reaction system are calculated according to equations (3), (4). The cells v are classified in logarithmic classes according to equation (16), and class reactivities $W^{(k)}$ are calculated according to equation (17). Preferably the above described cell lists are set up in conjunction with a class list, which links cells of the reaction front to the different classes and vice versa.

Furthermore so-called ionization reactivities and neutralization reactivities of polymers are calculated for all cells v of the reaction front according to $$W_{I_{p,v}} = k_1 n_{p,v}^H \quad (19)$$

$$W_{N_{p,v}} = k_2 n_{p,v}^I \quad (20),$$

wherein p denotes a respective polymer, $W_{I_{p,v}}$ the ionization reactivity of all polymer sites of polymer p in cell v, $W_{N_{p,v}}$ the neutralization reactivity of all polymer sites of polymer p in cell v, $n_{p,v}^H$ the number of neutral polymer sites of polymer p in cell v and $n_{p,v}^I$ the number of ionized polymer sites of polymer p in cell v. $k_1$ and $k_2$ are model dependent factors fixing the time scale of the ionization and neutralization reactions.

Simulation of the Development Process:

In a first step 152, a time interval after which the chemical reaction system changes its state due to a chemical reaction is calculated according to $$\delta t = -\frac{1}{W_n}\ln(1-E), \quad E \in [0,1]. \quad (21)$$

Here $\delta t$ denotes the time interval and E is a uniformly distributed random number in the interval $[0,1[$.

Subsequently, a reacting class k is selected (step 153). For this, a parameter Y is calculated according to $$Y = W_n F, F \in [0,1[ \quad (22),$$

wherein F is a uniformly distributed random number in the interval $[0,1[$. After that, the class reactivities $W^{(k)}$ are successively substracted from Y according to $$Y \leftarrow Y - W^{(k)} \quad (23)$$

and a class k is accepted if Y becomes negative for the first time.

Afterwards, a reacting cell v within the selected class k is selected by means of a von Neumann rejection (step 154). For this, two uniformly distributed random numbers C, D in the interval $[0,1[$ are chosen independently from each other and it is calculated $$v = \lfloor mC \rfloor + 1, C \in [0,1[ \quad (24)$$

$$y = 2^k D, D \in [0,1[ \quad (25),$$

wherein m denotes the number of cells in class k. A cell v is selected if the condition $y \leq W_v$ is fulfilled. If a cell v is accepted, the algorithm is continued, otherwise this step 154 is repeated with new random numbers C, D.

Subsequently, a reacting polymer of the selected cell (step 155) and the type of chemical reaction (ionization or neutralization) is selected (step 156). These two steps 155, 156 can be carried out according to respective reactivity weights. Regarding this preferred embodiment of an enhanced Gillespie algorithm, the two steps 155, 156 are carried out in a combined manner, as is described in the following section:

At first, a parameter Z is calculated according to $$Z = W_v G, G \in [0,1[ \quad (26)$$

wherein G is a uniformly distributed random number in the interval $[0,1[$. After that, the ionization reactivities $W_{I_{p,v}}$ of all polymers p in the selected cell v are successively subtracted from the parameter Z according to $$Z \leftarrow Z - W_{I_{p,v}} \forall p \in [1, \ldots q] \quad (27),$$

wherein q denotes the number of polymers in cell v. An ionization of a respective polymer p in cell v is accepted when the condition $Z \leq 0$ is fulfilled for the first time. If $Z > 0$ after the subtraction of all ionized q polymers, it is continued by subtracting neutralization reactivities $W_{N_{p,v}}$ from Z according to $$Z \leftarrow Z - W_{N_{p,v}} \forall p \in [1, \ldots q] \quad (28)$$

until $Z \leq 0$, meaning that an ionized polymer site in polymer p in cell v is neutralized.

If the fraction of ionized polymer sites of a polymer has not reached the critical ionization level yet, the reactivities are actualized, a cell is moved into an appropriate new class in order to satisfy equation (16) if necessary (step 157) and the algorithm is repeated, beginning again in step 152. Otherwise, if a polymer is ionized and exceeds the critical ionization level (step 158), the polymer is removed from the cell lattice by removing polymer sites of the same from all cells the polymer runs through (dissolution of the polymer).

For this, the polymer is removed from the actual reacting cell at first and the reactivities and the class list are updated (step 159). If, as a consequence of this dissolution process the respective lattice cell contains no more polymer sites, i.e. if the respective cell has a cell reactivity equal to zero and comprises no protected or blocked polymer sites (step 160), the respective cell is developed and all surrounding cells within the reaction radius are added to the reaction front (step 161). At the same time, cell reactivities of these newly added cells are calculated, and the cells are sorted into respective classes.

Afterwards, it is checked if the polymer to be dissolved runs through other cells (step 162). If yes, the described steps 159 to 162 are repeated with respect to the next cell(s) comprising polymer sites of the polymer to be dissolved (step 163). Otherwise, the algorithm is repeated beginning with step 152 in order to calculate the next time interval.

Figure 8:
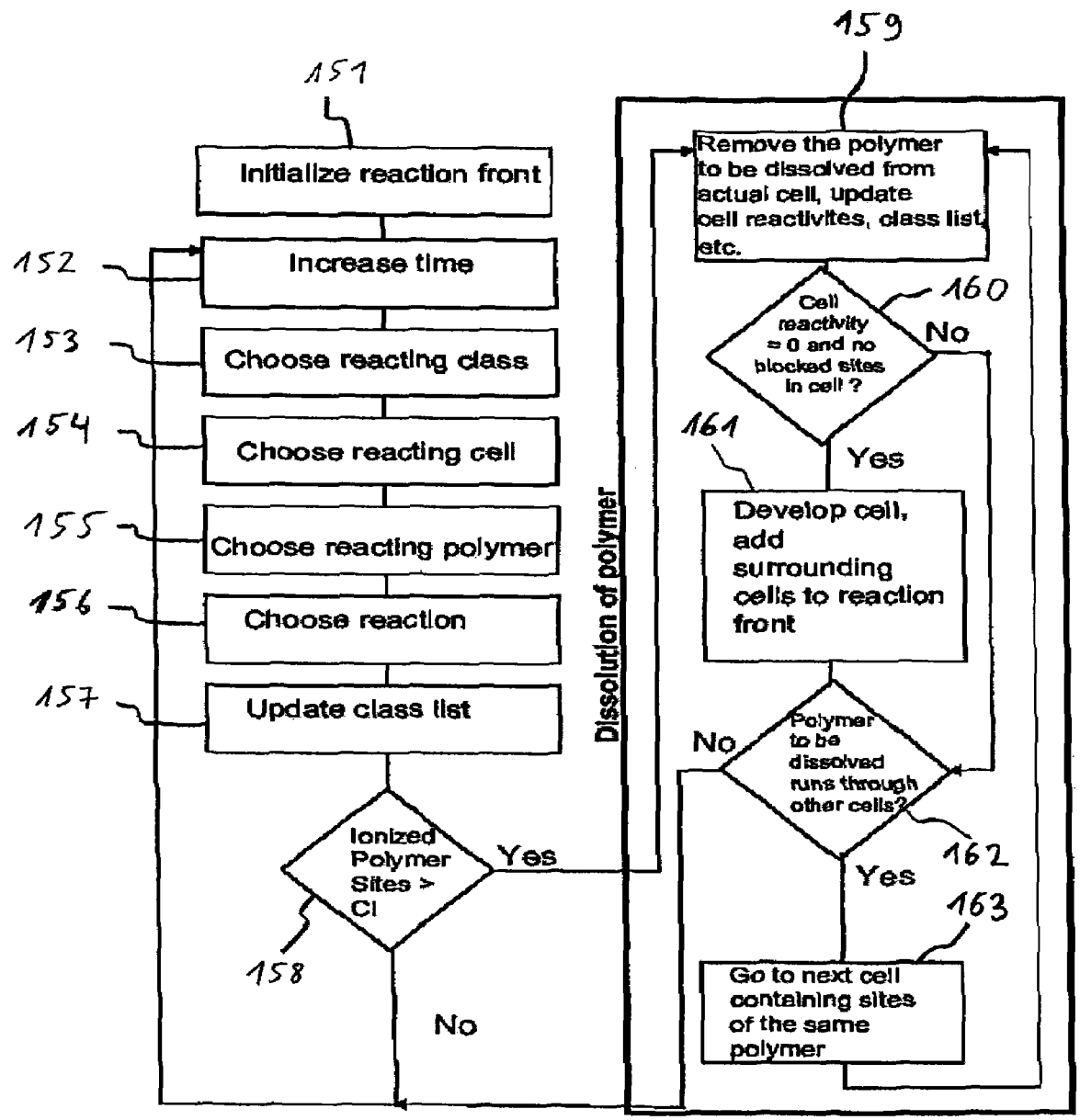
FIG. 8 is a flow diagram of a preferred embodiment of an algorithm according to the invention for solving a chemical master equation.

The enhanced Gillespie algorithm depicted in FIG. 8 is carried out for the given development time. If this time is reached or exceeded, the algorithm is stopped.

Figure 9:
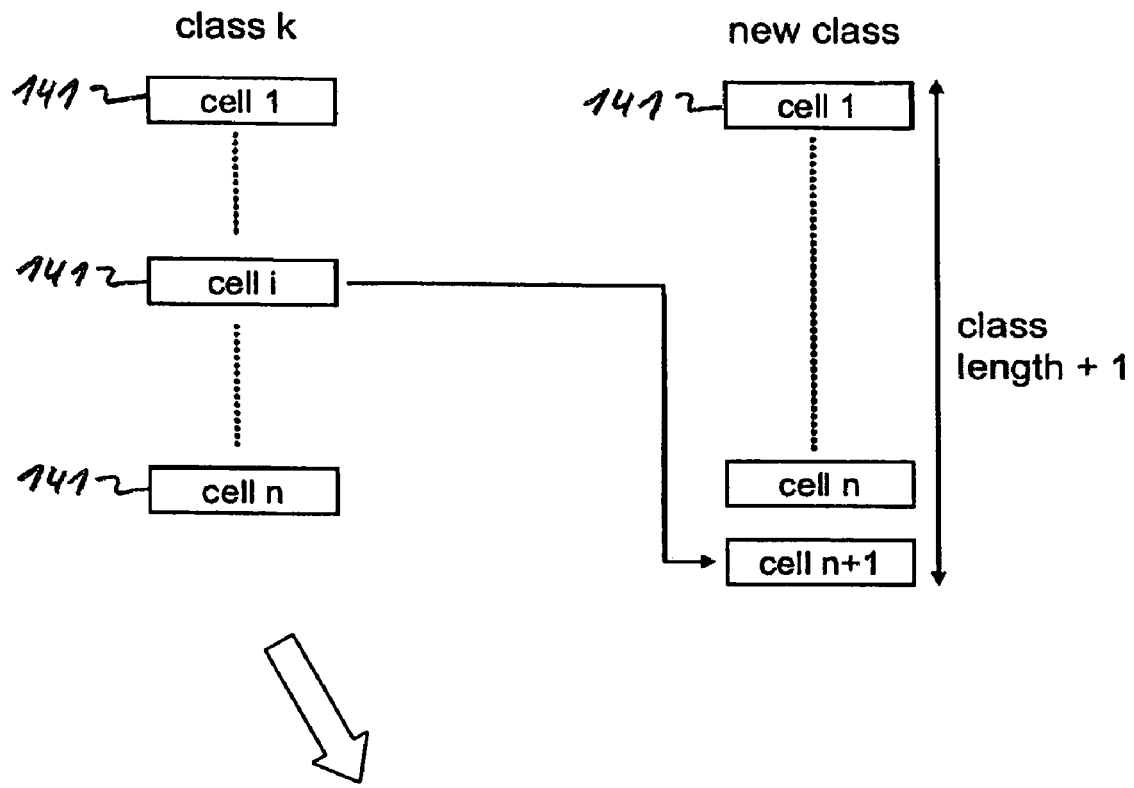
FIG. 9 is a diagram illustrating updating of a class list according to a preferred embodiment of the invention.
Figure 9:
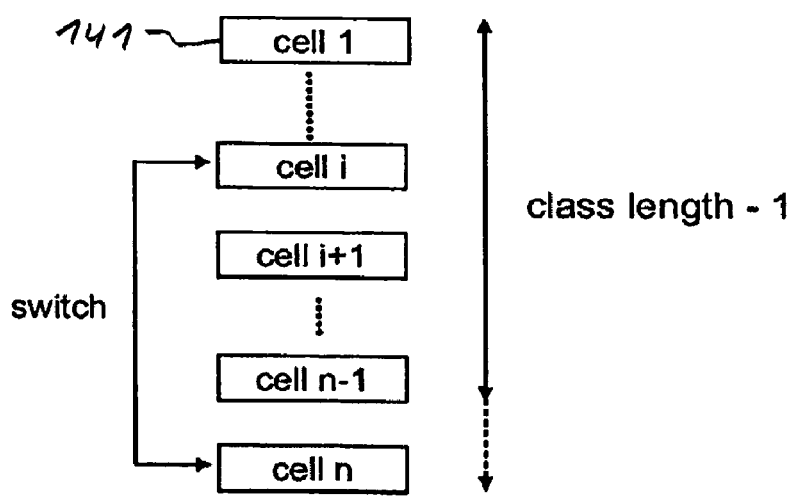

FIG. 9 shows a diagram illustrating updating of a class list according to a preferred embodiment of the invention. Here the class list is updated by first sorting an actual cell 141 denoted by i of a class k into an appropriate new class. As a consequence, the class length of the new class is increased by 1. Afterwards, the respective cell i is removed from the old class k by switching cell i with the last cell 141, in this case denoted by n, and then the class length of the old class k is reduced by 1.

The described embodiment of an enhanced Gillespie algorithm makes it possible to solve the chemical master equation (1) in a fast and efficient manner in order to determine developed and non-developed cells of the volume of the photoresist at the end of the development process (step 104 of the method depicted in FIG. 2). Consequently, the final developed edge profile of the photoresist can be derived from the largest cluster of non-developed cells still connected with a substrate (step 105).

Figure 10:
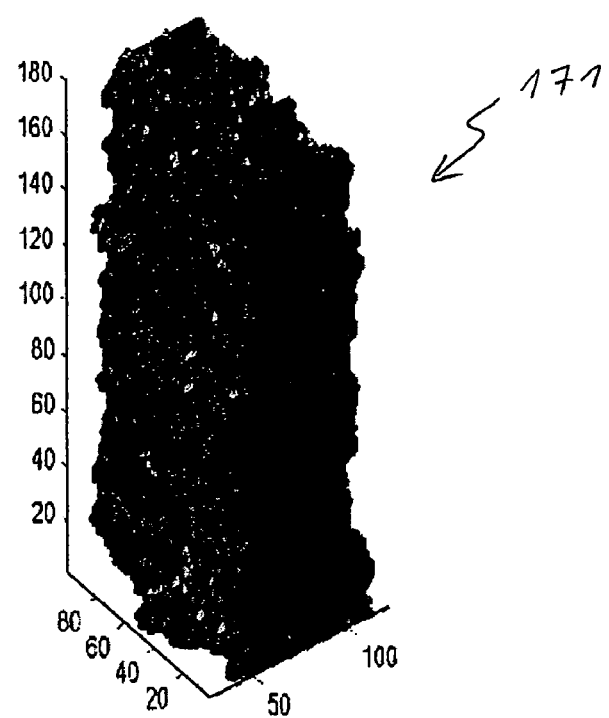
FIGS. 10 to 12 are calculated edge profiles of a volume of a photoresist after a development process for different molecular weights of polymers of the photoresist.
Figure 11:
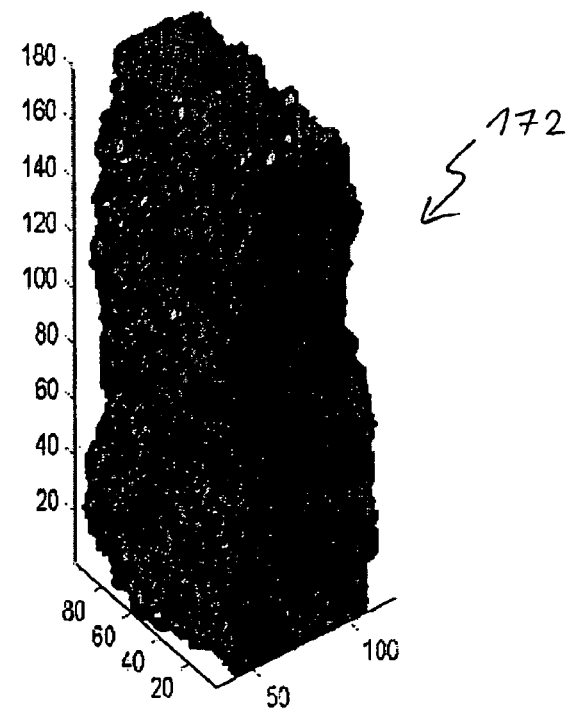
Figure 12:
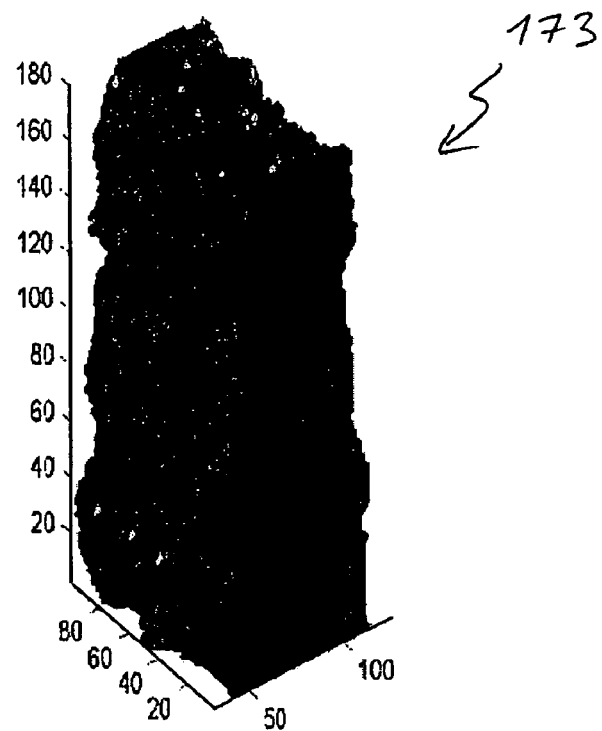

The following FIGS. 10, 11 and 12 show calculated edge profiles 171, 172, and 173 of a volume of a photoresist after a development process for different molecular weights of polymers by way of illustration. The calculations were carried out on the basis of the inventive method depicted in FIG. 2. In each case, the initial volume of the photoresist was 100×150×180 nm$^3$ which was divided into 337500 equal cells having a cell volume of 2×2×2 nm$^3$. Photoresist polymers were distributed with the same length with no variance around the mean on the cell lattice. Thereby a molecular weight of 5600 was taken as a basis for the resist profile 171 of FIG. 10 and molecular weights of 16700 and 21100 for the resist profiles 172 and 173 depicted in FIGS. 11 and 12, respectively.

The fraction of protected polymer sites was 40%. The initial spatial distribution of protected polymer sites was defined on the basis of a simulation of a post exposure bake preceding the development process, which was carried out by means of a stochastic approach. Input data applied in the simulation of the post exposure bake was, amongst other things, the output data of a simulation of an exposure step preceding the post exposure bake. For the simulation of the exposure step, a lines and spaces structure was used as lithographic structure having line widths and distances of 75 nm.

The reaction radius was set to 6 nm and the critical ionization was set to 75%. The development time was set to 10 seconds. The factor $k_1$ was set to 100 and the factor $k_2$ to 1, in this way representing a ratio between the probability of an ionization reaction and the probability of a neutralization reaction of 100:1. The computation time for each of the developed resist profiles 171, 172 and 173 was around 100 seconds.

Figure 13:
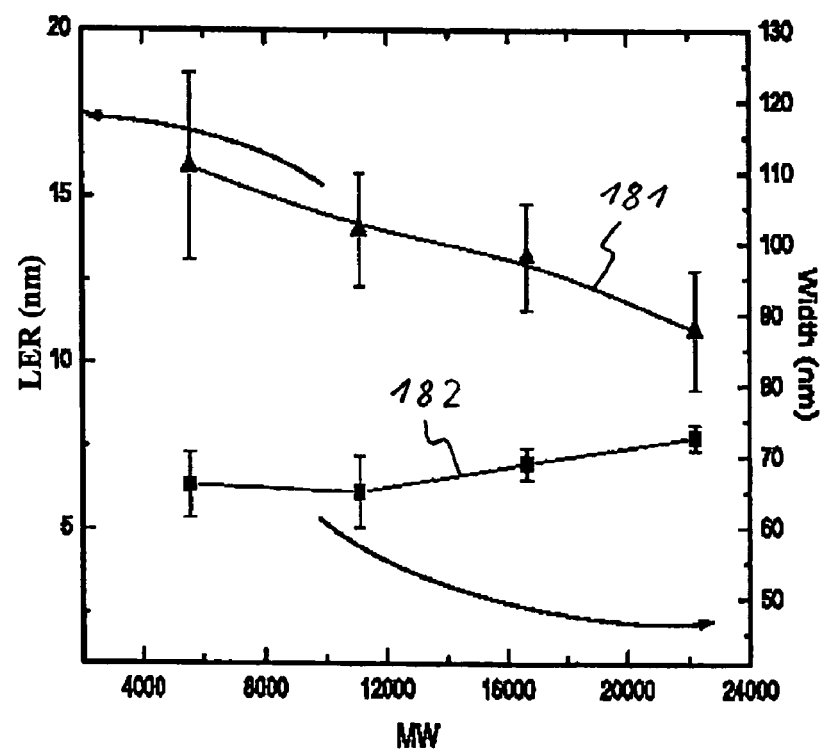
FIG. 13 are graphs of a line edge roughness and a width over molecular weight according to the edge profiles depicted in the preceding FIGS. 10 to 12.

FIG. 13 shows a graph 181 of a line edge roughness (LER) and a graph 182 of a line width over molecular weight (MW), which are based upon the calculated resist profiles 171, 172 and 173 according to the preceding FIGS. 10, 11 and 12. Clearly the influence of molecular weight of the polymers (which corresponds to a polymer length) on the line edge roughness and on the line width can be seen, thereby illustrating the "predictive power" of the inventive method:

In the case of an increasing molecular weight the line edge roughness decreases whereas the line width increases. Contrary to the wide spread opinion that low molecular weight should reduce line edge roughness it does not. This can be explained with fluctuations in the concentration of dissolution inhibitors, which corresponds to fluctuations in the spatial distribution of protected polymer sites. For large polymers, the fluctuations are reduced because the same average out over large polymers. However, for a low molecular weight this does not happen and fluctuations are much more pronounced. Thus line edge roughness is increased.

But when using polymers with a high molecular weight a problem shows up. Looking at the threshold intensity of the polymer resin it strongly depends on molecular weight as simulations with higher molecular weights lead to resist profiles with bigger line widths, which are not fully developed, thus threshold intensity is increased. This is due to the simple fact that the developer solution reacts only with a small portion of the polymers located in the surface of the photoresist as the polymers are twisted or folded around themselves many times, making it more difficult to ionize enough polymer sites of a polymer to meet the critical ionization level. How strongly this effect is present needs to be clarified in experiments. It should depend on the penetration depth of the developer solution.

While the present invention has been described in terms of specific embodiments, it is evident in view of the foregoing description that various variations and modifications may be carried out without departing from the scope of the invention. In particular the inventive method is not limited to the specified parameter values for a cell volume, a critical ionization level, a development time etc.

Moreover, the inventive method can be carried out regarding all kinds of positive and negative tone chemically amplified photoresists. In the case of a negative tone chemically amplified photoresist, an initial spatial distribution of polymer sites protected by dissolution inhibitors which corresponds to a distribution of cross-linked polymers is used as a starting point for the simulation of the development process though lacking an exact physical or chemical description.

In addition, the invention can also be applied for determining a developed edge profile of a photoresist having no chemical amplification. Here, deprotection (in the case of a positive tone resist) and cross-linking reactions (in the case of a negative tone resist) of polymers are initiated by so-called photoactive components (PAC). Accordingly, an initial distribution of protected and non-protected polymer sites can be provided in a similar manner, e.g. based on a simulation of deprotection or cross-linking reactions taking place in the course of a post exposure bake preceding the development process.

Moreover, the inventive method is not limited to simulating the development process of a lithographic lines and spaces structure. The method can be applied on various types of geometries, including contact holes and arbitrary line shapes.

What is claimed is:

1. A method for determining an edge profile of a volume of a photoresist after a development process, comprising:
   dividing the volume of the photoresist into cells;
   setting up a chemical master equation, the chemical master equation reflecting stochastic kinetics of chemical reactions proceeding in cells of the volume of the photoresist during the development process;
   solving the chemical master equation for a given development time based on a Gillespie algorithm to determine developed and non-developed cells of the volume of the photoresist at the end of the development process; and
   determining the edge profile of the volume of the photoresist after the development process based on a cluster of non-developed cells.

2. The method according to claim 1, wherein the chemical master equation reflects the stochastic kinetics of ionization and neutralization reactions between polymer sites of polymers comprised in the volume of the photoresist and components of a developer solution used for development of the photoresist.

3. The method according to claim 2, wherein a critical ionization level is defined for the polymers, wherein when a fraction of ionized polymer sites of a polymer exceeds the critical ionization level, the respective polymer is removed from the volume of the photoresist.

4. The method according to claim 2, wherein the ratio between a probability of an ionization reaction and the probability of a neutralization reaction is set to 100:1.

5. The method according to claim 1, wherein previous to solving the chemical master equation, an initial spatial distribution of polymers comprised in the volume of the photoresist at the beginning of a development process is defined.

6. The method according to claim 5, wherein the initial spatial distribution of the polymers is defined based on a molecular dynamic calculation.

7. The method according to claim 5, wherein the initial spatial distribution of the polymers is defined by assigning polymer sites of the polymers to the cells of the volume of the photoresist by a stochastic approach.

8. The method according to claim 1, wherein the volume of the photoresist comprises polymers having the same length.

9. The method according to claim 1, wherein the volume of the photoresist comprises polymers having lengths according to a length distribution.

10. The method according to claim 9, wherein the length distribution is based on measurements of characteristic parameters of a photoresist sample.

11. The method according to claim 1, wherein a reaction front and a reaction radius is defined, the reaction front comprises cells of the volume of the photoresist being accessible to a developer solution used for the development of the photoresist, wherein when a cell of the reaction front is developed, surrounding cells within the reaction radius are added to the reaction front.

12. The method according to claim 1, wherein each cell of the volume of the photoresist being accessible to a developer solution used for the development of the photoresist is assigned a cell reactivity, wherein in the course of solving the chemical master equation based on he Gillespie algorithm a reacting cell in which a chemical reaction proceeds is selected according to its cell reactivity.

13. The method according to claim 12, wherein the chemical master equation is solved by an enhanced Gillespie algorithm, the enhanced Gillespie algorithm comprises a von Neumann rejection to select a reacting cell of said volume of the photoresist.

14. The method according to claim 13, wherein the cells of the volume of the photoresist being accessible to the developer solution are classified in logarithmic classes according to the cell reactivities, wherein each logarithmic class is assigned a class reactivity, and wherein selecting a reacting cell comprises:
   selecting a reacting class according to its class reactivity; and
   selecting a reacting cell within the selected class.

15. A method for determining an edge profile of a volume of a photoresist after a development process, comprising:
   dividing the volume of the photoresist into cells, the cells having a given cell volume;
   setting up a chemical master equation, the chemical master equation reflecting a stochastic kinetics of chemical reactions proceeding in cells of the volume of the photoresist being accessible to a developer solution during the development process, wherein the volume of the photoresist is treated as a chemical reaction system, wherein the chemical master equation describes a time evolution of probability of the reaction system found in a state n at a time t during a development process provided it had been in an initial state n" at a time $t_0=0$ at a beginning of the development process according to $$\frac{\partial}{\partial t} p(n, t | n''),$$

wherein the state n and the state n" of the reaction system represent the number of photoresist components comprised in the cells of the volume of the photoresist at the respective times t and $t_0$;
   defining an initial spatial distribution of photoresist components comprised in the cells of the volume of the photoresist at the beginning of a development process;
   solving the chemical master equation for a given development time based on a Gillespie algorithm to determine developed and non-developed cells of the volume of the photoresist at the end of the development process; and
   determining the edge profile of the volume of the photoresist after the development process based on a cluster of non-developed cells.

16. The method according to claim 15, wherein the chemical master equation reflects the stochastic kinetics of ionization and neutralization reactions between polymer sites of polymers comprised in the volume of the photoresist and components of the developer solution during the development process according to the equation $$\frac{\partial}{\partial t} p(\ldots, n_v^H, n_v^I, n_v^P, \ldots, t \mid n'') =$$
$$\sum_v k_1(n_v^H + 1) p(\ldots, n_v^H + 1, n_v^I, n_v^P, \ldots, t \mid n'') +$$
$$\sum_v k_2(n_v^I + 1) p(\ldots, n_v^H, n_v^I + 1, n_v^P, \ldots, t \mid n'') -$$
$$p(\ldots, n_v^H, n_v^I, n_v^P, \ldots, t \mid n'') \times \sum_v (k_1 n_v^H + k_2 n_v^I),$$

wherein $n_v^H$ denotes the number of neutral polymer sites, $n_v^I$ the number of ionized polymer sites and $n_v^P$ the number of protected polymer sites in a cell denoted by a cell index $v$, and wherein $k_1$ and $k_2$ are factors which fix a time scale of the ionization and the neutralization reactions.

17. The method according to claim 16, wherein an initial spatial distribution of the protected polymer sites comprised in the volume of the photoresist at the beginning of the development process is defined on the basis of a spatial distribution of dissolution inhibitors.

18. The method according to claim 17, wherein the spatial distribution of the dissolution inhibitors is determined based on a simulation of chemical reactions proceeding in the volume of the photoresist during a post exposure bake preceding the development process.

19. The method according to claim 15, wherein a time interval after which a transition of a state of the reaction system to a different state is determined according to the equation $$\delta t = -\frac{1}{W_n} \ln(1 - E),$$

wherein $\delta t$ denotes the time interval, $W_n$ a total reactivity of the reaction system and E a uniformly distributed random number in the interval [0,1.]

\* \* \* \* \*